(12) United States Patent
Cuong et al.

(10) Patent No.: US 9,412,624 B1
(45) Date of Patent: Aug. 9, 2016

(54) INTEGRATED CIRCUIT PACKAGING SYSTEM WITH SUBSTRATE AND METHOD OF MANUFACTURE THEREOF

(71) Applicants: Dao Nguyen Phu Cuong, Singapore (SG); Bartholomew Liao Chung Foh, Singapore (SG); Byung Tai Do, Singapore (SG); Kyung Moon Kim, Seongnam (KR); Jeffrey David Punzalan, Singapore (SG); SeungYong Chai, Hwaseong-si (KR); Soo Won Lee, Yongin-si (KR); Kwok Keung Szeto, Singapore (SG); KyungOe Kim, Daejeon (KR)

(72) Inventors: Dao Nguyen Phu Cuong, Singapore (SG); Bartholomew Liao Chung Foh, Singapore (SG); Byung Tai Do, Singapore (SG); Kyung Moon Kim, Seongnam (KR); Jeffrey David Punzalan, Singapore (SG); SeungYong Chai, Hwaseong-si (KR); Soo Won Lee, Yongin-si (KR); Kwok Keung Szeto, Singapore (SG); KyungOe Kim, Daejeon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 14/316,090

(22) Filed: Jun. 26, 2014

(51) Int. Cl.
*H01L 29/72* (2006.01)
*H01L 21/48* (2006.01)
*H01L 21/56* (2006.01)
*H01L 23/538* (2006.01)

(52) U.S. Cl.
CPC .......... *H01L 21/4857* (2013.01); *H01L 21/568* (2013.01); *H01L 23/5383* (2013.01)

(58) Field of Classification Search
CPC .................................................. H01L 23/5226
USPC .......................................... 257/774; 438/126
See application file for complete search history.

(56) References Cited

U.S. PATENT DOCUMENTS

| | | | |
|---|---|---|---|
| 4,888,450 A | 12/1989 | Lando et al. | |
| 5,324,687 A | 6/1994 | Wojnarowski | |
| 6,670,718 B2 | 12/2003 | Chinda et al. | |
| 7,365,006 B1 | 4/2008 | Huemoeller et al. | |
| 7,543,374 B2 | 6/2009 | Nakamura | |
| 7,939,377 B1 | 5/2011 | Katagiri et al. | |
| 7,981,728 B2 | 7/2011 | Cho | |
| 8,294,276 B1 | 10/2012 | Kim et al. | |
| 8,416,577 B2 | 4/2013 | Wang et al. | |
| 8,624,382 B2 | 1/2014 | Tseng et al. | |
| 2007/0076348 A1 | 4/2007 | Shioga et al. | |
| 2009/0183909 A1* | 7/2009 | Cho | 174/262 |
| 2010/0052127 A1 | 3/2010 | Choi et al. | |
| 2014/0027167 A1 | 1/2014 | Kim et al. | |
| 2014/0035095 A1 | 2/2014 | Lin et al. | |
| 2014/0326295 A1* | 11/2014 | Moslehi | 136/249 |
| 2015/0008566 A1 | 1/2015 | Gerber et al. | |

FOREIGN PATENT DOCUMENTS

KR  10-20100093356  9/2010

OTHER PUBLICATIONS

U.S. Appl. No. 14/316,013, filed Jun. 26, 2014, Chi et al.
U.S. Appl. No. 14/316,190, filed Jun. 26, 2014, Chi et al.
Electronic Materials & System Equipment Group Functional Materials Division, MSDS No. EL-AE1244-13, Material Safety Data Sheet, Aug. 24, 2011, p. 4 Tatsuta Electric Wire & Cable Co., Ltd.
Electronic Materials & System Equipment Group Functional Materials Division, MSDS No. EL-AE1650-7, Material .. Safety.. Data.. Sheet, Oct. 31, 2013, p. 4 Tatsuta Electric Wire & Cable Co.,Ltd.
Electronic Materials & System Equipment Group Functional Materials Division, MSDS No. EL-AE3030-10, Material Safety Data Sheet, May 18, 2011, p. 4 Tatsuta Electric Wire & Cable Co., Ltd.
Samsung Electro-Mechanics, Introduction of Conductive paste filled CSP, Confidential, Aug. 12, 2010, p. 9, Samsung.

* cited by examiner

*Primary Examiner* — Edward Wojciechowicz
(74) *Attorney, Agent, or Firm* — Wong & Rees LLP

(57) ABSTRACT

An integrated circuit packaging system, and a method of manufacture thereof, including: a substrate including: a first trace layer, an encapsulation on the first trace layer, the first trace layer having a surface exposed from the encapsulation with a rough texture characteristic of removal of a conductive carrier coating, a second trace layer on the encapsulation and over the first trace layer, the second trace layer connected to the first trace layer; and an integrated circuit die attached to the substrate.

20 Claims, 9 Drawing Sheets

INTEGRATED CIRCUIT PACKAGING SYSTEM WITH SUBSTRATE AND METHOD OF MANUFACTURE THEREOF

CROSS-REFERENCE TO RELATED APPLICATION(S)

The present application contains subject matter related to concurrently filed U.S. patent application Ser. No. 14/316, 013. The related application is assigned to STATS ChipPAC, Ltd. and the subject matter thereof is incorporated herein by reference thereto.

The present application contains subject matter related to concurrently filed U.S. patent application Ser. No. 14/316, 190. The related application is assigned to STATS ChipPAC, Ltd. and the subject matter thereof is incorporated herein by reference thereto.

TECHNICAL FIELD

The present invention relates generally to an integrated circuit packaging system, and more particularly to a system with a substrate.

BACKGROUND ART

Semiconductor chips have become progressively more complex, driven in large part by the need for increasing processing power in a smaller chip size for compact or portable electronic devices such as cell phones, smart phones, personal media systems, or ultraportable computers.

As sizes of chips and chip packages shrink, manufacturing complexity increases. A layered substrate is an important part of many chip packages to support and protect the chip. One common material for substrates is "prepreg" which stands for "pre-impregnated" composite fibers where a binding agent is already present. However, prepreg is relatively expensive material, and is not easily processed.

Thus, a need still remains for an easier and cheaper way to form substrates. In view of the shrinking sizes of electronic components, it is increasingly critical that answers be found to these problems. Growing consumer expectations and the diminishing opportunities for meaningful product differentiation in the marketplace make it critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a prepared carrier having a conductive carrier coating; depositing a first trace layer on the conductive carrier coating; forming an encapsulation on the first trace layer; forming a second trace layer over the first trace layer and on the encapsulation, the second trace layer connected to the first trace layer; removing the prepared carrier while leaving the conductive carrier coating on the first trace layer; removing all of the conductive carrier coating, the first trace layer having a surface exposed from the encapsulation with a rough texture characteristic of removal of the conductive carrier coating; and connecting an integrated circuit die to the first trace layer.

The present invention provides an integrated circuit packaging system including: a substrate including: a first trace layer, an encapsulation on the first trace layer, the first trace layer having a surface exposed from the encapsulation with a rough texture characteristic of removal of a conductive carrier coating, a second trace layer on the encapsulation and over the first trace layer, the second trace layer connected to the first trace layer; and an integrated circuit die attached to the substrate.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
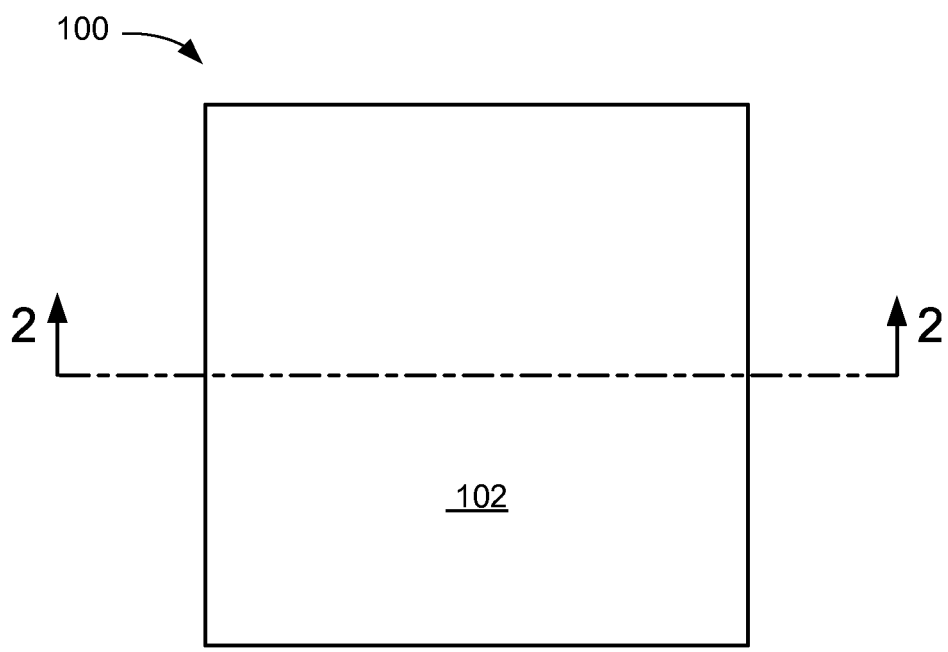
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane of the original positioning of the carrier, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure.

The term "processing" as used herein includes deposition of material or photoresist, patterning, exposure, development, etching, cleaning, and/or removal of the material or photoresist as required in forming a described structure. Wavy lines at the sides of figures indicate that only a portion of the full structure is shown.

Referring now to FIG. 1, therein is shown a top view of an integrated circuit packaging system 100 in a first embodiment of the present invention. The integrated circuit packaging system 100 can include a package body 102, which is a body or a molded structure of a package. The package body 102 can be formed with a molding material including a molding compound.

Figure 2:
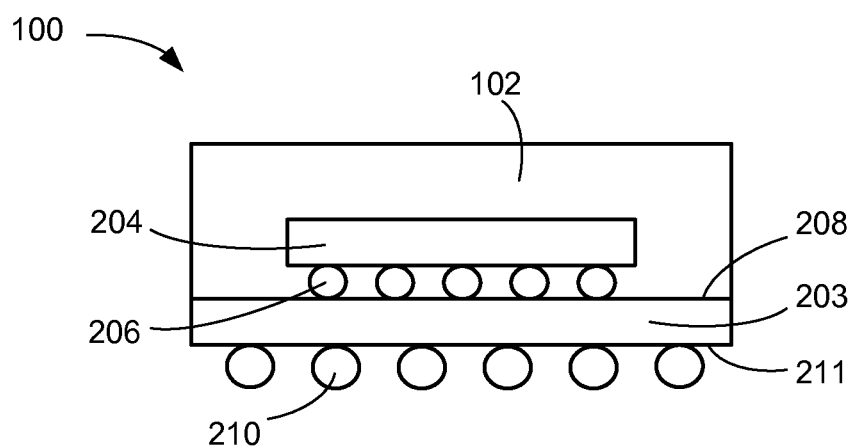
FIG. 2 is a cross-sectional view of the integrated circuit packaging system taken along line 2-2 of FIG. 1.

Referring now to FIG. 2, therein is shown a cross-sectional view of the integrated circuit packaging system 100 taken along line 2-2 of FIG. 1. The integrated circuit packaging system 100 can include a substrate 203 for mounting and connecting a semiconductor device. The integrated circuit packaging system 100 can include an integrated circuit die 204 mounted over and connected to the substrate 203.

The integrated circuit packaging system 100 can include internal connectors 206 attached to and between the integrated circuit die 204 and a device side 208 of the substrate 203. An encapsulation 102 can be formed over the device side 208, the integrated circuit die 204, and the internal connectors 206.

The integrated circuit packaging system 100 can include external connectors 210 attached to a system side 211 of the substrate 203 to provide electrical connectivity to an external system (not shown). The system side 211 is a surface of the substrate 203 opposite to the device side 208. The substrate 203 can provide electrical connections through the substrate 203 and between the device side 208 and the system side 210.

Figure 3:
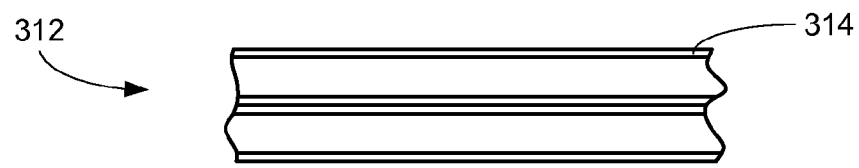
FIG. 3 is a prepared carrier in a cross-sectional view of the integrated circuit packaging system along the section line 2-2 of FIG. 1 in a beginning phase of manufacture.

Referring now to FIG. 3, therein is shown a prepared carrier 312 in a cross-sectional view of the integrated circuit packaging system 100 along the section line 2-2 of FIG. 1 in a beginning phase of manufacture. The prepared carrier 312 is prepared by depositing a conductive carrier coating 314 on both sides of the prepared carrier 312. The prepared carrier 312 is shown in this example as having two layers, each which can serve as an individual carrier, but it is understood that this is for illustrative purposes only. For example, a single layer carrier can be used, but in this example, the prepared carrier 312 being two layers means that the prepared carrier 312 can be easily used to double throughput of the manufacturing process, as will be discussed later. Both layers of the prepared carrier 312 have the conductive carrier coating 314 on both sides of each layer, and the layers can be attached using an adhesive (not shown).

It has been discovered that using a two layer carrier for the prepared carrier 312 can improve process throughput and lower cost of manufacture. For example, because processes can be done in batches on both layers of the prepared carrier, at the same time, there is less use of equipment, quicker completion of manufacturing, and more efficient use of material.

Figure 4:
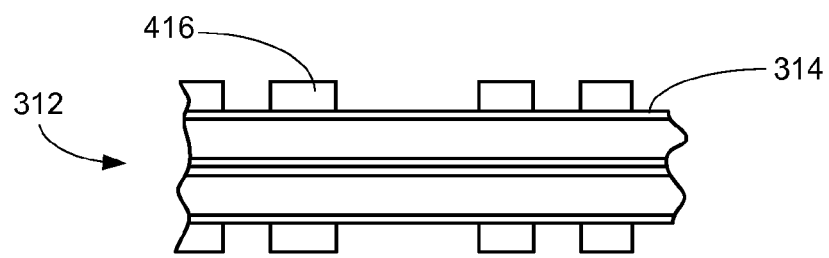
FIG. 4 is the structure of FIG. 3 in a first lamination phase of manufacture.

Referring now to FIG. 4, therein is shown the structure of FIG. 3 in a first lamination phase of manufacture. A first dry film layer 416 is deposited on the conductive carrier coating 314 of the prepared carrier 312, and patterned with openings to leave portions of the conductive carrier coating 314 exposed. The first dry film layer 416 can be a material such as photoresist or other dry film, for example. The patterning of the first dry film layer 416 can be done through various methods such as developing using light, masking and etching, laser patterning, or other patterning methods.

When using a two-layer version of the prepared carrier 312, the first dry film layer 416 can be deposited and patterned on the conductive carrier coating 314 left exposed on each layer. In this example, the top and bottom surfaces of the two-layer version of the prepared carrier 312 are exposed for deposition of the first dry film layer 416.

Figure 5:
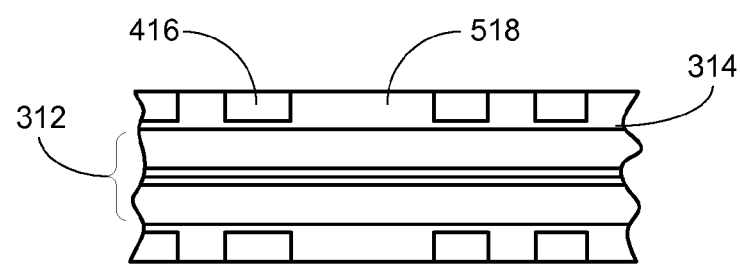
FIG. 5 is the structure of FIG. 4 in a first deposition phase of manufacture.

Referring now to FIG. 5, therein is shown the structure of FIG. 4 in a first deposition phase of manufacture. A first trace layer 518 is deposited in the openings and on the conductive carrier coating 314 left exposed by the pattern of the first dry film layer 416. The deposition can be through electrolytic or electroless plating, chemical vapor deposition, sputtering, or other deposition processes, for example. The first trace layer 518 can be formed from a conductive material much like the material used for the conductive carrier coating 314, or from a material different from the conductive carrier coating 314. For example, the first trace layer 518 can be formed from a metal such as copper, tin, gold, silver, platinum, tungsten, or other conductive metal or alloy thereof. In this example, no line is shown between the conductive carrier coating 314 and the first trace layer 518 to indicate that the same materials are used for both, but it is understood that differing materials may be used as long as adhesion between them is not a problem.

As necessary, a planarization process can take place to planarize the surfaces of the first trace layer 518 and the first dry film layer 416. Deposition and patterning over the top of the prepared carrier 312 can be mirrored by the deposition and patterning on the bottom of the prepared carrier 312 as long as the prepared carrier 312 is two layers.

Figure 6:
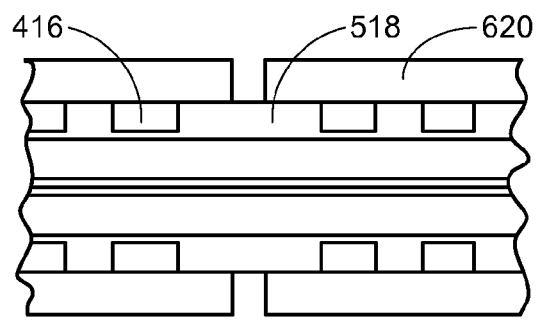
FIG. 6 is the structure of FIG. 5 in a second lamination phase of manufacture.

Referring now to FIG. 6, therein is shown the structure of FIG. 5 in a second lamination phase of manufacture. A second dry film layer 620 can be deposited on the first dry film layer 416 and the first trace layer 518. The second dry film layer 620 can then be patterned using a similar process as the patterning of the first dry film layer 416, leaving openings exposing portions of the first trace layer 518.

Figure 7:
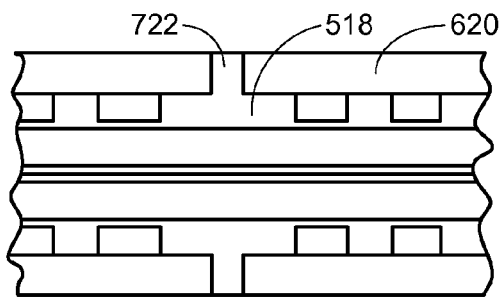
FIG. 7 is the structure of FIG. 6 in a second deposition phase of manufacture.

Referring now to FIG. 7, therein is shown the structure of FIG. 6 in a second deposition phase of manufacture. A first via layer 722 can be deposited in the pattern of the second dry film layer 620 and on selected locations of the first trace layer 518. The first via layer 722 can function to connect and route electrical signals from the first trace layer 518 to other conductive structures through the first via layer 722, for example. The first via layer 722 can be deposited in the pattern of the second dry film layer 620 through electrolytic or electroless plating, chemical vapor deposition, sputtering, or other deposition processes, for example. The first via layer 722 can be formed from a metal such as copper, tin, gold, silver, platinum, tungsten, or other conductive metal or alloy thereof. In this example, the first via layer 722 is the same material as the first trace layer 518, but it is understood that any compatible combination of conductive materials can be used. The first via layer 722 can have vertical sidewalls as a result of deposition within the openings of the second dry film layer 620.

Figure 8:
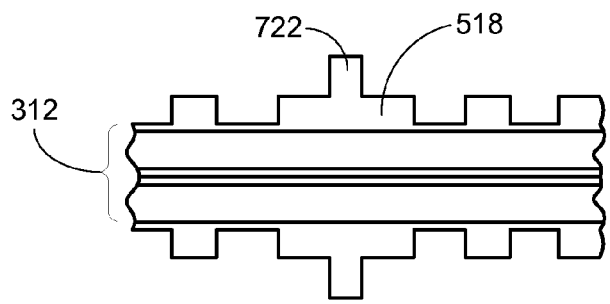
FIG. 8 is the structure of FIG. 7 in a first removal phase of manufacture.

Referring now to FIG. 8, therein is shown the structure of FIG. 7 in a first removal phase of manufacture. After the deposition of the first via layer 722, both the first dry film layer 416 of FIG. 4 and the second dry film layer 620 of FIG. 6 can be removed in the same process, leaving only the first trace layer 518 and the first via layer 722 on the prepared carrier 312.

It has been discovered that removing both the first dry film layer 416 and the second dry film layer 620 in a single process improves process throughput and simplifies manufacturing. As compared to removing dry film layers in separate processes and progressively using thicker and thicker layers of the dry film, removing the dry film layers in one process uses less material overall, simplifies manufacturing flow due to repeating similar processes with similar tolerances, and improves reliability of result.

It has been discovered that forming the first via layer 722 in the second dry film layer 620 after patterning allows for a smaller total package size. Rather than drilling out holes for vias in a dielectric material, patterning of the second dry film layer 620 allows for smaller via diameters (for example, down to 20 micrometers in diameter), which allows for more routing options, which leads to better routing and ultimately a reduction in the size of the substrate required for the integrated circuit packaging system 100.

Figure 9:
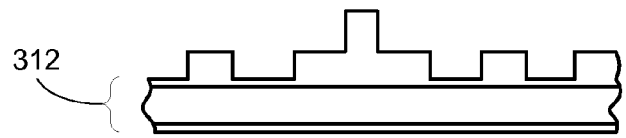
FIG. 9 is the structure of FIG. 8 in a separation phase of manufacture.

Referring now to FIG. 9, therein is shown the structure of FIG. 8 in a separation phase of manufacture. When a two-layer version of the prepared carrier 312 is used, it is at this phase of manufacture that the two layers can be separated. Because both layers have been prepared the same way, both can go through the later steps of manufacture in the same manner. For clarity, the process for further manufacture will be described using only one of the layers after separation.

Figure 10:
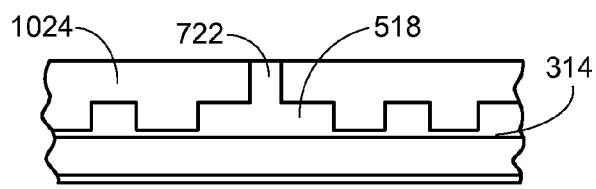
FIG. 10 is the structure of FIG. 9 in a first molding phase of manufacture.

Referring now to FIG. 10, therein is shown the structure of FIG. 9 in a first molding phase of manufacture. An encapsulation 1024 is formed on the first via layer 722, the first trace layer 518, and the conductive carrier coating 314. The encapsulation 1024 is formed such that only a top surface of the first via layer 722 is exposed from the encapsulation 1024. This can be done in various ways. For example, the encapsulation 1024 can be molded through a film-assist molding process, or the encapsulation can be molded to fully cover the first via layer 722 and then planarized back down to expose the top surface of the first via layer 722. Exposing the top surface of the first via layer 722 can be done through grinding, abrading, or other planarization process, for example. Due to the planarization process, the top surface of the first via layer 722 can be coplanar with a top surface of the encapsulation 1024.

It has been discovered that molding the encapsulation 1024 on the first via layer 722 followed by planarizing the encapsulation 1024 to expose the top surface of the first via layer 722 reduces manufacturing time and cost. As compared to laser drilling, grinding the encapsulation 1024 down to expose the first via layer 722 is a very quick and cheap process, with effective and easy control over thickness of the encapsulation 1024.

It has also been discovered that molding the encapsulation 1024 on the first via layer 722 followed by grinding the encapsulation 1024 to expose the top surface of the first via layer 722 reduces the overall thickness of a resulting package. Due to having great control over the thickness of the encapsulation 1024 in the grinding process, the substrate 203 of FIG. 2 can be made as thin as possible, leading to a thinner final package.

It has been further discovered that using the encapsulation 1024 as a core material for forming the substrate 203 of FIG. 2 reduces cost and improves manufacturing reliability. Unlike other dielectric materials used in a substrate core such as pre-impregnated composite materials, the encapsulation 1024 can be molded using equipment that cause also serve to encapsulate integrated circuit dies on substrates, reducing capital cost and leveraging institutional knowledge of how to efficiently mold encapsulation material.

Figure 11:
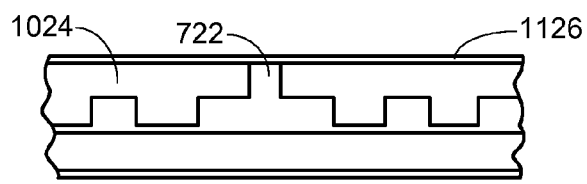
FIG. 11 is the structure of FIG. 10 in a seed layer deposition phase of manufacture.

Referring now to FIG. 11, therein is shown the structure of FIG. 10 in a seed layer deposition phase of manufacture. A conductive seed layer 1126 is deposited on the top surface of the first via layer 722 and the top surface of the encapsulation 1024. The conductive seed layer 1126 facilitates a later deposition step.

Figure 12:
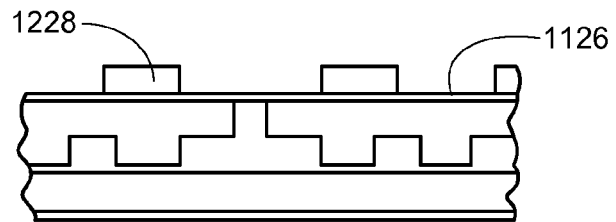
FIG. 12 is the structure of FIG. 11 in a third lamination phase of manufacture.

Referring now to FIG. 12, therein is shown the structure of FIG. 11 in a third lamination phase of manufacture. A third dry film layer 1228 is deposited on the conductive seed layer 1126, and patterned with openings to leave portions of the conductive seed layer 1126 exposed. The third dry film layer 1228 can be a material such as photoresist or other dry film, for example. The patterning of the third dry film layer 1228 can be done through various methods such as developing using light, masking and etching, laser patterning, or other patterning methods.

Figure 13:
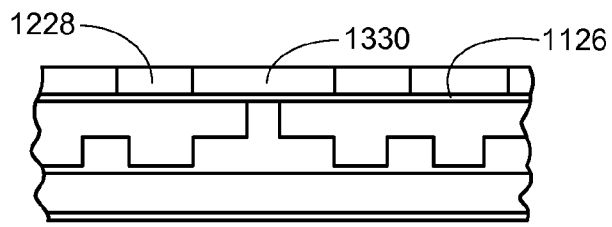
FIG. 13 is the structure of FIG. 12 in a third deposition phase of manufacture.

Referring now to FIG. 13, therein is shown the structure of FIG. 12 in a third deposition phase of manufacture. A second trace layer 1330 is deposited in the openings of the third dry film layer 1228 and on the conductive seed layer 1126 left exposed by the pattern of the third dry film layer 1228. The deposition can be through electrolytic or electroless plating, chemical vapor deposition, sputtering, or other deposition processes, for example. The second trace layer 1330 can be formed from a conductive material much like the material used for the conductive seed layer 1126, or from a material different from the conductive seed layer 1126. For example, the second trace layer 1330 can be formed from a metal such as copper, tin, gold, silver, platinum, tungsten, or other conductive metal or alloy thereof.

Figure 14:
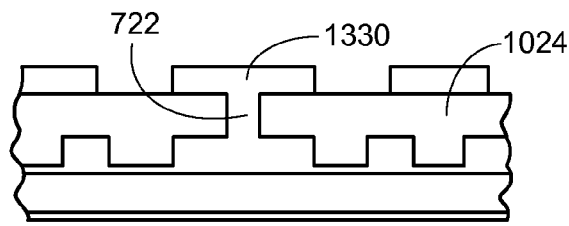
FIG. 14 is the structure of FIG. 13 in a second removal phase of manufacture.

Referring now to FIG. 14, therein is shown the structure of FIG. 13 in a second removal phase of manufacture. In this example, the conductive seed layer 1126 of FIG. 11 is the same material as the second trace layer 1330 and so is considered part of the second trace layer 1330, which is also the formed using the same material as the first via layer 722. The third dry film layer 1228 of FIG. 12 is removed, followed by removal of the conductive seed layer 1126 from spaces between the various parts of the second trace layer 1330 in a separate process.

The removal of the conductive seed layer 1126 can be done through a process such as etching, grinding, or other removal process. The removal process can leave the top surface of the encapsulation 1024 with a rough or uneven surface characteristic of an etching process, for example.

Figure 15:
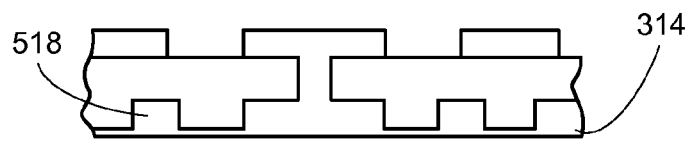
FIG. 15 is the structure of FIG. 14 in a carrier removal phase of manufacture.

Referring now to FIG. 15, therein is shown the structure of FIG. 14 in a carrier removal phase of manufacture. The prepared carrier 312 of FIG. 3 is separated from the various layers which have been built up on the prepared carrier 312. The conductive carrier coating 314 is left on the first trace layer 518.

Figure 16:
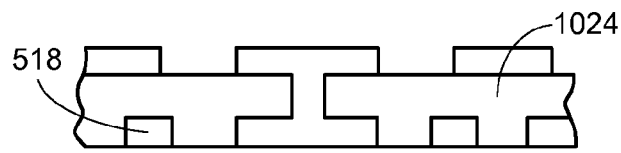
FIG. 16 is the structure of FIG. 15 in a coating removal phase of manufacture.

Referring now to FIG. 16, therein is shown the structure of FIG. 15 in a coating removal phase of manufacture. The conductive carrier coating 314 of FIG. 3 can be removed from the first trace layer 518 through a process such as etching, grinding, or other removal process. The removal of the conductive carrier coating 314 can leave a bottom surface of the first trace layer 518 and a bottom surface of the encapsulation 1024 with a rough or uneven surface characteristic of an etching process, for example.

Figure 17:
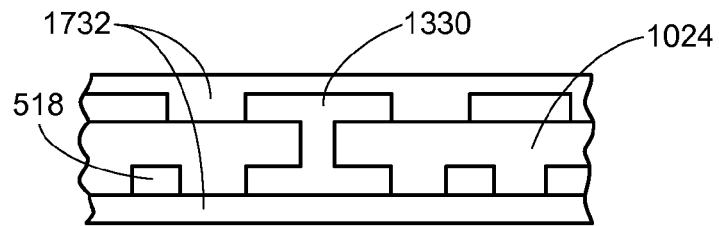
FIG. 17 is the structure of FIG. 16 in an outer dielectric coating phase of manufacture.

Referring now to FIG. 17, therein is shown the structure of FIG. 16 in an outer dielectric coating phase of manufacture. A protective layer 1732 is applied to contact the first trace layer 518, the second trace layer 1330, and the encapsulation 1024. The protective layer 1732 can be a material such as solder resist, for example. The protective layer 1732 can protect portions of the first trace layer 518 and the second trace layer 1330 from the outside environment.

Figure 18:
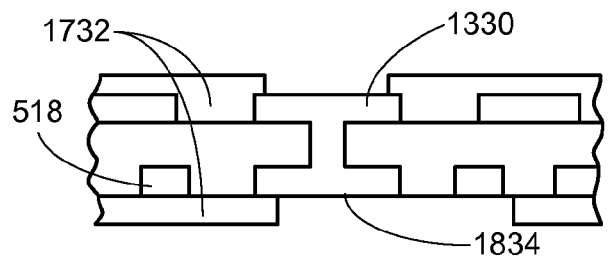
FIG. 18 is the structure of FIG. 17 in an outer dielectric patterning phase of manufacture.

Referring now to FIG. 18, therein is shown the structure of FIG. 17 in an outer dielectric patterning phase of manufacture. The protective layer 1732 is patterned to remove portions of the protective layer 1732 so as to expose contacts 1834 of the first trace layer 518 and the second trace layer 1330.

Figure 19:
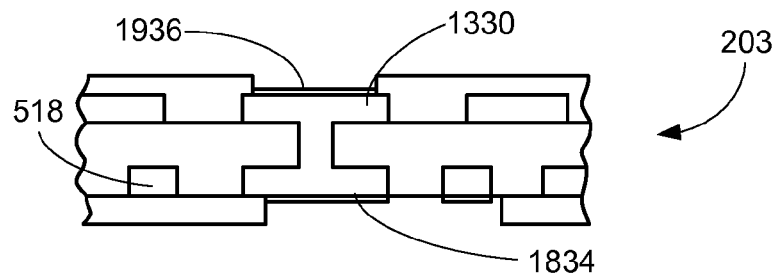
FIG. 19 is the structure of FIG. 18 in a surface finish phase of manufacture.

Referring now to FIG. 19, therein is shown the structure of FIG. 18 in a surface finish phase of manufacture. The contacts 1834 of the first trace layer 518 and the second trace layer 1330, and any other exposed surfaces of the first trace layer 518 and the second trace layer 1330 are coated with a surface finish 1936 to complete the substrate 203 as a two-layer embedded trace substrate. The surface finish 1936 can protect the trace layers from corrosion and other environmental dangers. The surface finish 1936 can also function to improve solder adhesion or bond wire adhesion as required by the use case of the final package.

The integrated circuit die 204 of FIG. 2 can be attached to the contacts 1834 of either the first trace layer 518 or the second trace layer 1330, and the package body 102 of FIG. 1 can be formed on the integrated circuit die 204 and the substrate 203 in order to complete the integrated circuit packaging system 100 of FIG. 1.

Figure 20:
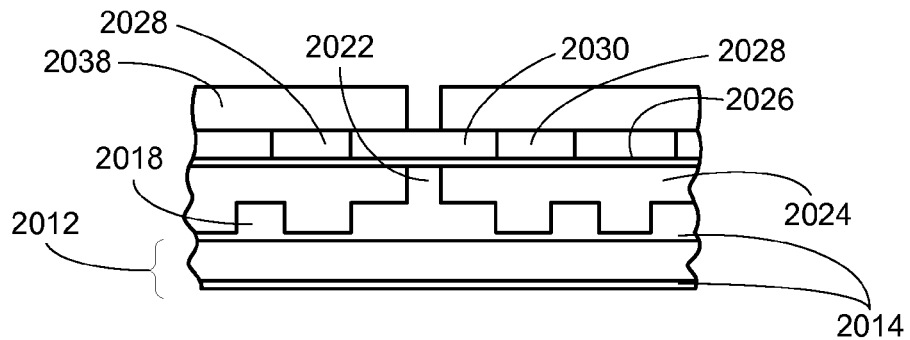
FIG. 20 is an alternative process flow using the structure of FIG. 13 in a fourth lamination phase of manufacture in a second embodiment of the present invention.

Referring now to FIG. 20, therein is shown an alternative process flow using the structure of FIG. 13 in a fourth lamination phase of manufacture in a second embodiment of the present invention. While the process steps up to FIG. 18 are for forming a two layer embedded trace substrate, from this figure until FIG. 32, steps will be described for forming a three-layer embedded trace substrate. Elements from FIG. 13 are renumbered in this embodiment to start with "20" for clarity, but other properties of the elements remain the same. Visible in this figure is a first trace layer 2018 connected to a first via layer 2022 which is connected to a second trace layer 2030 through a conductive seed layer 2026. The first trace layer 2018 and the first via layer 2022 are covered in an encapsulation 2024. The first trace layer 2018 is on a prepared carrier 2012 having a conductive carrier coating 2014. A third dry film layer 2028 is on the conductive seed layer 2026 and patterned to define the boundaries of the second trace layer 2030.

A fourth dry film layer 2038 is applied on the third dry film layer 2028 and the second trace layer 2030. The fourth dry film layer 2038 can be patterned with openings to leave portions of the second trace layer 2030 exposed. The fourth dry film layer 2038 can be a material such as photoresist or other dry film, for example. The patterning of the fourth dry film layer 2038 can be done through various methods such as developing using light, masking and etching, laser patterning, or other patterning methods.

Figure 21:
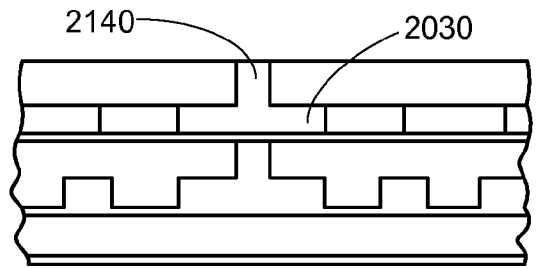
FIG. 21 is the structure of FIG. 20 in a fourth deposition phase of manufacture.

Referring now to FIG. 21, therein is shown the structure of FIG. 20 in a fourth deposition phase of manufacture. A second via layer 2140 can be deposited on the second trace layer 2030. The deposition can be through electrolytic or electroless plating, chemical vapor deposition, sputtering, or other deposition processes, for example. The second via layer 2140 can be formed from a conductive material much like the material used for the second trace layer 2030. For example, the second via layer 2140 can be formed from a metal such as copper, tin, gold, silver, platinum, tungsten, or other conductive metal or alloy thereof.

Figure 22:
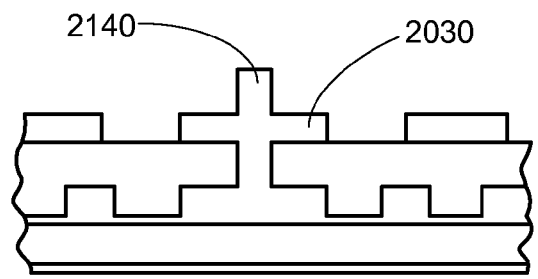
FIG. 22 is the structure of FIG. 21 in a third removal phase of manufacture.

Referring now to FIG. 22, therein is shown the structure of FIG. 21 in a third removal phase of manufacture. The third dry film layer 2028 of FIG. 12 and the fourth dry film layer 2038 of FIG. 20 can both be removed at the same time in the same removal step, leaving the second trace layer 2030 and the second via layer 2140 exposed.

It has been discovered that removing both the third dry film layer 2028 and the fourth dry film layer 2038 in a single process improves process throughput and simplifies manufacturing. As compared to removing dry film layers in separate processes and progressively using thicker and thicker layers of the dry film, removing the dry film layers in one process uses less material overall, simplifies manufacturing flow due to repeating similar processes with similar tolerances, and improves reliability of result.

Figure 23:
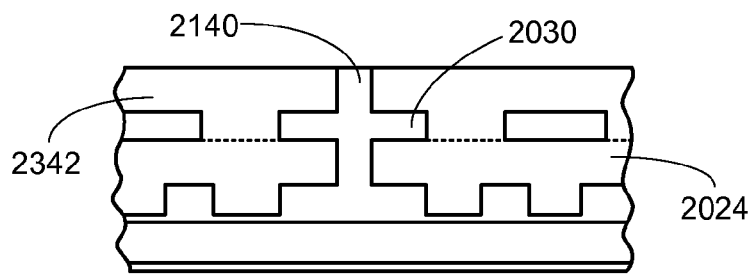
FIG. 23 is the structure of FIG. 22 in a second molding phase of manufacture.

Referring now to FIG. 23, therein is shown the structure of FIG. 22 in a second molding phase of manufacture. An additional encapsulation layer 2342 is formed on the second via layer 2140, the second trace layer 2030, and the top surface of the encapsulation 2024. The additional encapsulation layer 2342 can be made from the same material as the encapsulation 2024 or a different material which has good adhesion to the encapsulation 2024. In this example, the materials used for the additional encapsulation layer 2342 and the encapsulation 2024 are the same but a dotted line is shown in this figure to clarify the different encapsulation layers. Later figures will show no dotted line to indicate that the materials used are the same, but it is understood that this is for example only.

The additional encapsulation layer 2342 is formed such that only a top surface of the second via layer 2140 is exposed from the additional encapsulation layer 2342. This can be done in various ways. For example, the additional encapsulation layer 2342 can be molded through a film-assist molding process, or the additional encapsulation layer 2342 can be molded to fully cover the second via layer 2140 and then planarized back down to expose the top surface of the second via layer 2140. Exposing the top surface of the second via layer 2140 can be done through grinding, abrading, or other planarization process, for example. Due to the planarization process, the top surface of the second via layer 2140 can be coplanar with a top surface of the additional encapsulation layer 2342.

It has been discovered that molding the additional encapsulation layer 2342 on the second via layer 2140 followed by planarizing the additional encapsulation layer 2342 to expose the top surface of the second via layer 2140 reduces manufacturing time and cost. As compared to laser drilling, grinding the additional encapsulation layer 2342 down to expose the second via layer 2140 is a very quick and cheap process, with effective and easy control over thickness of the additional encapsulation layer 2342.

It has also been discovered that molding the additional encapsulation layer 2342 on the second via layer 2140 followed by grinding the additional encapsulation layer 2342 to expose the top surface of the second via layer 2140 reduces the overall thickness of a resulting package. Due to having great control over the thickness of the additional encapsulation layer 2342 in the grinding process, the final three-layer embedded trace substrate can be made as thin as possible, leading to a thinner final package.

It has been further discovered that using the additional encapsulation layer 2342 as a core material for forming the three-layer embedded trace substrate reduces cost and improves manufacturing reliability. Unlike other dielectric materials used in a substrate core such as pre-impregnated composite materials, the additional encapsulation layer 2342 can be molded using equipment that cause also serve to encapsulate integrated circuit dies on substrates, reducing capital cost and leveraging institutional knowledge of how to efficiently mold encapsulation material.

Figure 24:
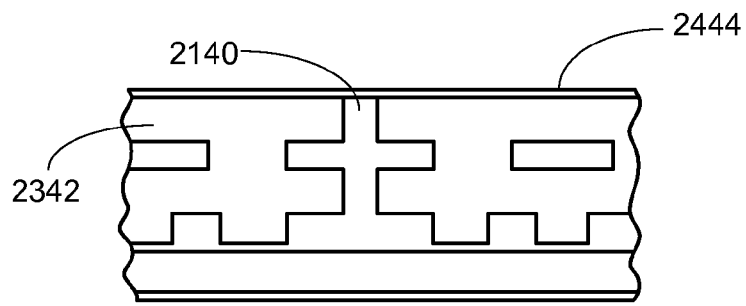
FIG. 24 is the structure of FIG. 23 in an additional seed layer deposition phase of manufacture.

Referring now to FIG. 24, therein is shown the structure of FIG. 23 in an additional seed layer deposition phase of manufacture. An additional seed layer 2444 can be deposited directly on the top surface of the second via layer 2140 and the additional encapsulation layer 2342 through a process such as electroless plating, for example.

Figure 25:
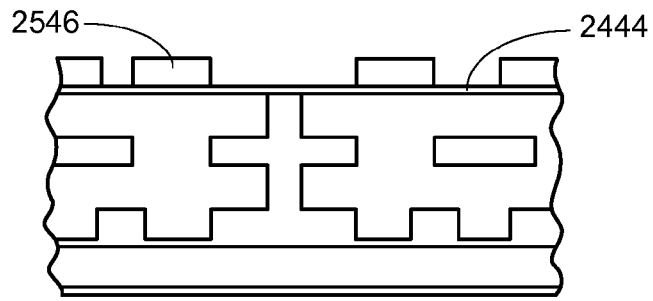
FIG. 25 is the structure of FIG. 24 in a fifth lamination phase of manufacture.

Referring now to FIG. 25, therein is shown the structure of FIG. 24 in a fifth lamination phase of manufacture. A fifth dry film layer 2546 is deposited on the additional seed layer 2444, and patterned with openings to leave portions of the additional seed layer 2444 exposed. The fifth dry film layer 2546 can be a material such as photoresist or other dry film, for example. The patterning of the fifth dry film layer 2546 can be done through various methods such as developing using light, masking and etching, laser patterning, or other patterning methods.

Figure 26:
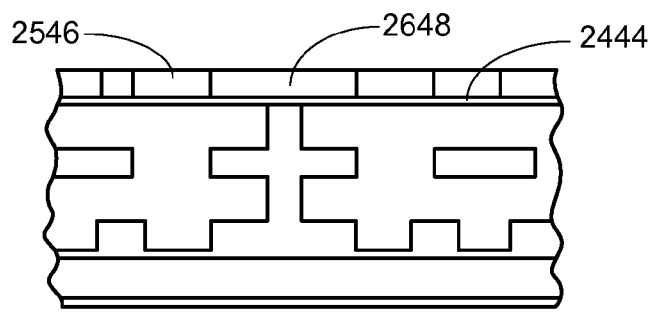
FIG. 26 is the structure of FIG. 25 in a fifth deposition phase of manufacture.

Referring now to FIG. 26, therein is shown the structure of FIG. 25 in a fifth deposition phase of manufacture. A third trace layer 2648 is deposited in the openings of the fifth dry film layer 2546 and on the additional seed layer 2444 left exposed by the pattern of the fifth dry film layer 2546. The deposition can be through electrolytic or electroless plating, chemical vapor deposition, sputtering, or other deposition processes, for example. The third trace layer 2648 can be formed from a conductive material much like the material used for the additional seed layer 2444, or from a material different from the additional seed layer 2444. For example, the third trace layer 2648 can be formed from a metal such as copper, tin, gold, silver, platinum, tungsten, or other conductive metal or alloy thereof.

Figure 27:
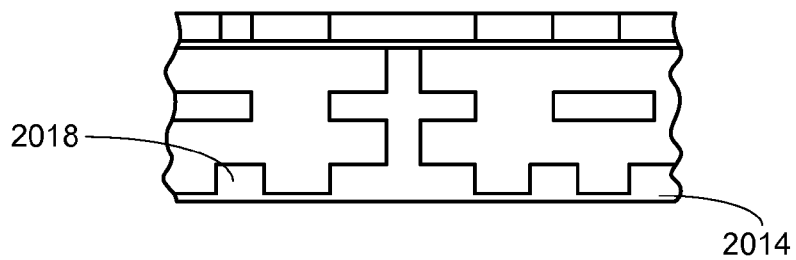
FIG. 27 is the structure of FIG. 26 in an alternative carrier removal phase of manufacture.

Referring now to FIG. 27, therein is shown the structure of FIG. 26 in an alternative carrier removal phase of manufacture. The prepared carrier 2012 of FIG. 20 is separated from the various layers which have been built up on the prepared carrier 2012. The conductive carrier coating 2014 is left on the first trace layer 2018.

Figure 28:
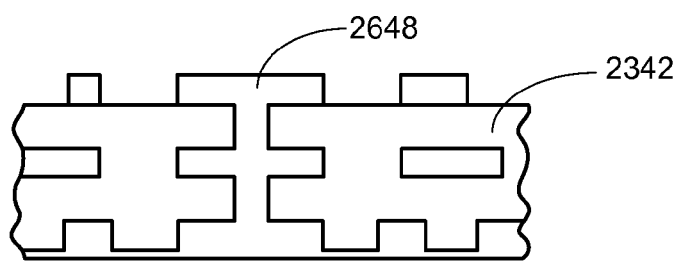
FIG. 28 is the structure of FIG. 27 in a fourth removal phase of manufacture.

Referring now to FIG. 28, therein is shown the structure of FIG. 27 in a fourth removal phase of manufacture. The fifth dry film layer 2546 of FIG. 25 can be removed, leaving the third trace layer 2648 and the additional seed layer 2444 of FIG. 24 exposed. The additional seed layer 2444 can be removed in a separate process.

The removal of the additional seed layer 2444 can be done through a process such as etching, grinding, or other removal process. The removal process can leave the top surface of the additional encapsulation layer 2342 with a rough or uneven surface characteristic of an etching process, for example.

Figure 29:
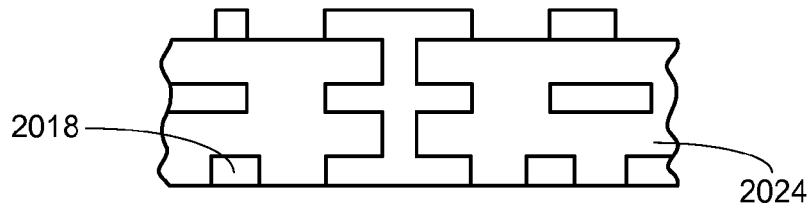
FIG. 29 is the structure of FIG. 28 in a coating removal phase of manufacture.

Referring now to FIG. 29, therein is shown the structure of FIG. 28 in a coating removal phase of manufacture. The conductive carrier coating 2014 of FIG. 20 can be removed from the first trace layer 2018 through a process such as etching, grinding, or other removal process. The removal of the conductive carrier coating 2014 can leave a bottom surface of the first trace layer 2018 and a bottom surface of the encapsulation 2024 with a rough or uneven surface characteristic of an etching process, for example.

Figure 30:
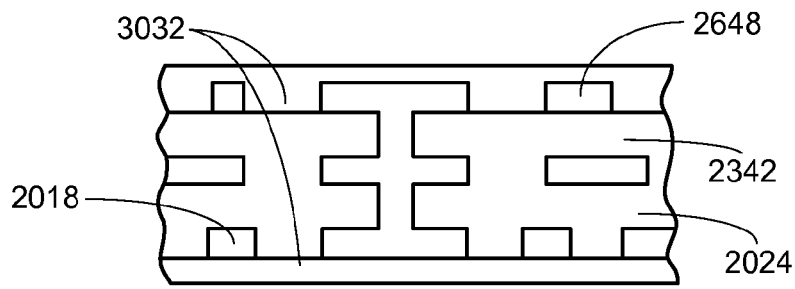
FIG. 30 is the structure of FIG. 29 in an outer dielectric coating phase of manufacture.

Referring now to FIG. 30, therein is shown the structure of FIG. 29 in an outer dielectric coating phase of manufacture. A protective layer 3032 is applied to contact the first trace layer 2018, the third trace layer 2648, the encapsulation 2024, and the additional encapsulation layer 2342. The protective layer 3032 can be a material such as solder resist, for example. The protective layer 3032 can protect portions of the first trace layer 2018 and the third trace layer 2648 from the outside environment.

Figure 31:
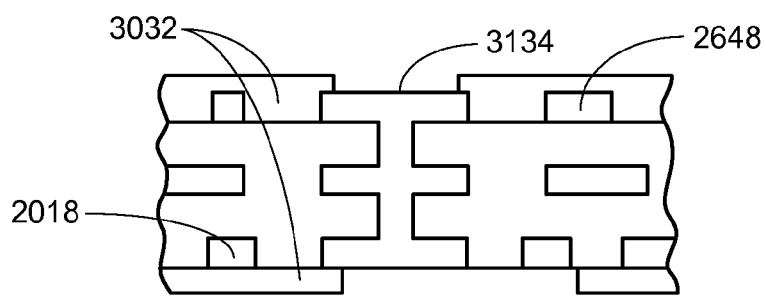
FIG. 31 is the structure of FIG. 30 in an outer dielectric patterning phase of manufacture.

Referring now to FIG. 31, therein is shown the structure of FIG. 30 in an outer dielectric patterning phase of manufacture. The protective layer 3032 is patterned to remove portions of the protective layer 3032 so as to expose contacts 3134 of the first trace layer 2018 and the third trace layer 2648.

Figure 32:
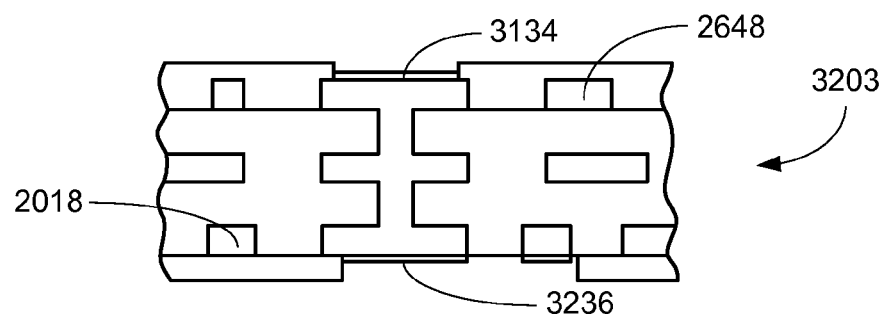
FIG. 32 is the structure of FIG. 31 in a surface finish phase of manufacture.

Referring now to FIG. 32, therein is shown the structure of FIG. 31 in a surface finish phase of manufacture. The contacts 3134 of the first trace layer 2018 and the third trace layer 2648, and any other exposed surfaces of the first trace layer 2018 and the third trace layer 2648 are coated with a surface finish 3236 to complete a substrate 3203 as a three-layer embedded trace substrate. The surface finish 3236 can protect the trace layers from corrosion and other environmental dangers. The surface finish 3236 can also function to improve solder adhesion or bond wire adhesion as required by the use case of the final package.

The integrated circuit die 204 of FIG. 2 can be attached to the contacts 3134 of either the first trace layer 2018 or the third trace layer 2648, and the package body 102 of FIG. 1 can be formed on the integrated circuit die 204 and the substrate 3203 in order to complete the second embodiment of the integrated circuit packaging system using a three-layer embedded trace substrate.

Figure 33:
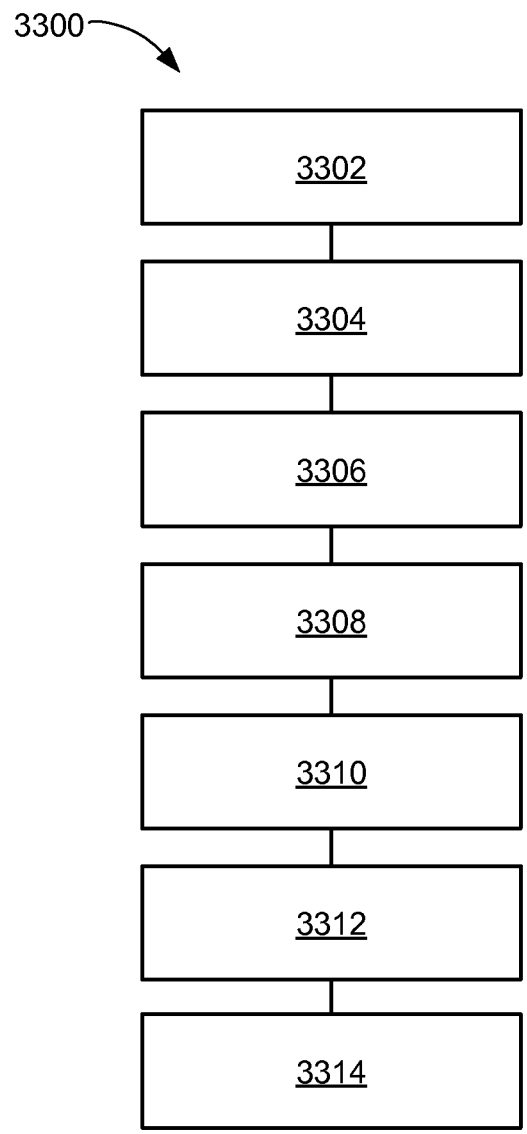
FIG. 33 is a flow chart of a method of manufacture of the integrated circuit packaging system in a further embodiment of the present invention.

Referring now to FIG. 33, therein is shown a flow chart of a method 3300 of manufacture of the integrated circuit packaging system 100 in a further embodiment of the present invention. The method 3300 includes: providing a prepared carrier having a conductive carrier coating in a block 3302; depositing a first trace layer on the conductive carrier coating in a block 3304; forming an encapsulation on the first trace layer in a block 3306; forming a second trace layer over the first trace layer and on the encapsulation, the second trace layer connected to the first trace layer in a block 3308; removing the prepared carrier while leaving the conductive carrier coating on the first trace layer in a block 3310; removing all of the conductive carrier coating, the first trace layer having a surface exposed from the encapsulation with a rough texture characteristic of removal of the conductive carrier coating in a block 3312; and connecting an integrated circuit die to the first trace layer in a block 3314.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a prepared carrier having a conductive carrier coating;
   depositing a first trace layer on the conductive carrier coating;
   forming a first via layer on the first trace layer, the first via layer having vertical sidewalk;
   forming an encapsulation on the first trace layer and the first via layer;
   planarizing the encapsulation for exposing a top surface of the first trace layer;
   forming a second trace layer over the first trace layer and on the encapsulation, the second trace layer connected to the first trace layer;
   removing the prepared carrier while leaving the conductive carrier coating on the first trace layer;
   removing all of the conductive carrier coating, the first trace layer having a surface exposed from the encapsulation with a rough texture characteristic of removal of the conductive carrier coating;
   applying a protective layer on the first trace layer and the second trace layer; and
   connecting an integrated circuit die to the first trace layer.

2. The method as claimed in claim 1 further comprising:
   depositing a first dry film layer on the conductive carrier coating; and
   patterning the first dry film layer for forming openings exposing portions of the conductive carrier coating.

3. The method as claimed in claim 1 further comprising applying the protective layer on the encapsulation.

4. The method as claimed in claim 1 further comprising:
   depositing a first dry film layer on the conductive carrier coating;
   patterning the first dry film layer for forming openings exposing portions of the conductive carrier coating;
   depositing the first trace layer on the conductive carrier coating and in the openings of the first dry film layer;
   depositing a second dry film layer on the first trace layer and the first dry film layer;
   patterning the second dry film layer for forming openings exposing portions of the first trace layer;
   depositing the first via layer on the first trace layer and in the openings of the second dry film layer; and
   removing the first dry film layer and the second dry film layer in the same removal process.

5. The method as claimed in claim 1 wherein providing the prepared carrier includes providing a two-layer carrier.

6. A method of manufacture of an integrated circuit packaging system comprising:
   providing a prepared carrier having a conductive carrier coating;
   depositing a first dry film layer on the conductive carrier coating;
   patterning the first dry film layer for forming openings exposing portions of the conductive carrier coating;
   depositing a first trace layer on the conductive carrier coating in the openings of the first dry film layer;
   depositing a second dry film layer on the first trace layer and the first dry film layer;
   patterning the second dry film layer for forming openings exposing portions of the first trace layer;
   depositing a first via layer on the first trace layer and in the openings of the second dry film layer, the first via layer having vertical sidewalls;
   removing the first dry film layer and the second dry film layer in the same removal process;
   forming an encapsulation on the first trace layer and the first via layer;
   planarizing the encapsulation for exposing a top surface of the first via layer;
   forming a second trace layer over the first trace layer, on the encapsulation, and on the first via layer, the second trace layer connected to the first trace layer through the first via layer;
   removing the prepared carrier while leaving the conductive carrier coating on the first trace layer;

removing all of the conductive carrier coating, the first trace layer having a surface exposed from the encapsulation with a rough texture characteristic of removal of the conductive carrier coating;

applying a protective layer on the first trace layer, the second trace layer, and the encapsulation; and connecting an integrated circuit die to the first trace layer.

7. The method as claimed in claim 6 further comprising applying a surface finish to the first trace layer.

8. The method as claimed in claim 6 further comprising:

depositing a conductive seed layer on the first via layer and the encapsulation;

depositing a third dry film layer on the conductive seed layer;

forming the second trace layer on the conductive seed layer and in openings of the third dry film layer;

removing the third dry film layer; and removing the conductive seed layer from between the second trace layer, the second trace layer and the encapsulation having a rough surface characteristic of removal of the third dry film layer and the conductive seed layer.

9. The method as claimed in claim 6 further comprising forming a third trace layer over the second trace layer.

10. The method as claimed in claim 6 further comprising forming a package body on the integrated circuit die.

11. An integrated circuit packaging system comprising:

a substrate including:

a first trace layer, a first via layer on the first trace layer, the first via layer having vertical sidewalls, an encapsulation on the first trace layer and the first via layer, the first trace layer having a surface exposed from the encapsulation with a rough texture characteristic of removal of a conductive carrier coating, a second trace layer on the encapsulation and over the first trace layer, the second trace layer connected to the first trace layer through the first via layer, a protective layer on the first trace layer and the second trace layer; and an integrated circuit die attached to the substrate.

12. The system as claimed in claim 11 further comprising external connectors attached to the substrate.

13. The system as claimed in claim 11 wherein the protective layer is on the encapsulation.

14. The system as claimed in claim 11 wherein the first via layer is on and between the first trace layer and the second trace layer.

15. The system as claimed in claim 11 wherein the encapsulation has a surface, coplanar with the surface of the first trace layer having a rough texture, which has a rough texture characteristic of removal of the conductive carrier coating.

16. The system as claimed in claim 11 further comprising:

external connectors attached to the substrate; and wherein:

the protective layer is on the encapsulation.

17. The system as claimed in claim 16 further comprising a surface finish on the first trace layer.

18. The system as claimed in claim 16 wherein the second trace layer has a rough surface characteristic of removal of a conductive seed layer.

19. The system as claimed in claim 16 further comprising a third trace layer over the second trace layer.

20. The system as claimed in claim 16 further comprising a package body on the integrated circuit die.

* * * * *